(12) United States Patent
Maeda

(10) Patent No.: US 6,750,137 B1
(45) Date of Patent: Jun. 15, 2004

(54) METHOD AND APPARATUS FOR FORMING AN INTERLAYER INSULATING FILM AND SEMICONDUCTOR DEVICE

(75) Inventor: Kazuo Maeda, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 09/519,599

(22) Filed: Mar. 6, 2000

(30) Foreign Application Priority Data

Mar. 26, 1999 (JP) ............................................ 11-083180

(51) Int. Cl.[7] ...................... H01L 21/4763; H01L 21/31
(52) U.S. Cl. ........................ 438/622; 438/639; 438/788; 438/789
(58) Field of Search ................................. 438/627, 639, 438/787, 790, 622, 629, 788, 789

(56) References Cited

U.S. PATENT DOCUMENTS

| | | | |
|---|---|---|---|
| 5,494,859 A | 2/1996 | Kapoor | 437/235 |
| 5,593,741 A | 1/1997 | Ikeda | 427/579 |
| 5,610,105 A | 3/1997 | Vines et al. | 437/235 |
| 5,723,386 A | 3/1998 | Ishikawa | 438/787 |
| 6,117,725 A * | 9/2000 | Huang | 438/241 |
| 6,133,162 A * | 10/2000 | Suzuki et al. | 438/780 |
| 6,211,069 B1 * | 4/2001 | Hu et al. | 438/637 |
| 6,281,113 B1 * | 8/2001 | Maeda | 438/624 |
| 6,297,175 B1 * | 10/2001 | Iyer | 438/787 |
| 6,395,627 B1 * | 5/2002 | Hoshino et al. | 438/622 |
| 6,413,879 B1 * | 7/2002 | Maeda | 438/758 |

FOREIGN PATENT DOCUMENTS

| | | |
|---|---|---|
| EP | 0 874 391 A2 | 4/1997 |
| EP | 1 037 275 A1 | 3/1999 |
| EP | 1 039 523 A2 | 3/1999 |
| JP | 6168930 | 6/1994 |
| JP | 6349831 | 12/1994 |
| JP | 897208 | 4/1996 |
| JP | 09-275103 | 10/1997 |

* cited by examiner

Primary Examiner—T. N. Quach
(74) Attorney, Agent, or Firm—Lorusso, Loud & Kelly

(57) ABSTRACT

A method for forming an interlayer insulating film includes the steps of forming an underlying insulating film on a substrate; forming a film containing B (boron), C (carbon) and $H_2O$) on the underlying insulating film by plasma enhanced chemical vapor deposition using a source gas containing an Si—C—O—H compound, an oxidative gas and a compound containing B (boron); releasing C (carbon) and $H_2O$ in the film from the film by annealing the film, and thereby forming a porous $SiO_2$ film containing B (boron); and subjecting to the porous $SiO_2$ film containing B (boron) to H (hydrogen) plasma treatment, and then forming a cover insulating film.

26 Claims, 12 Drawing Sheets

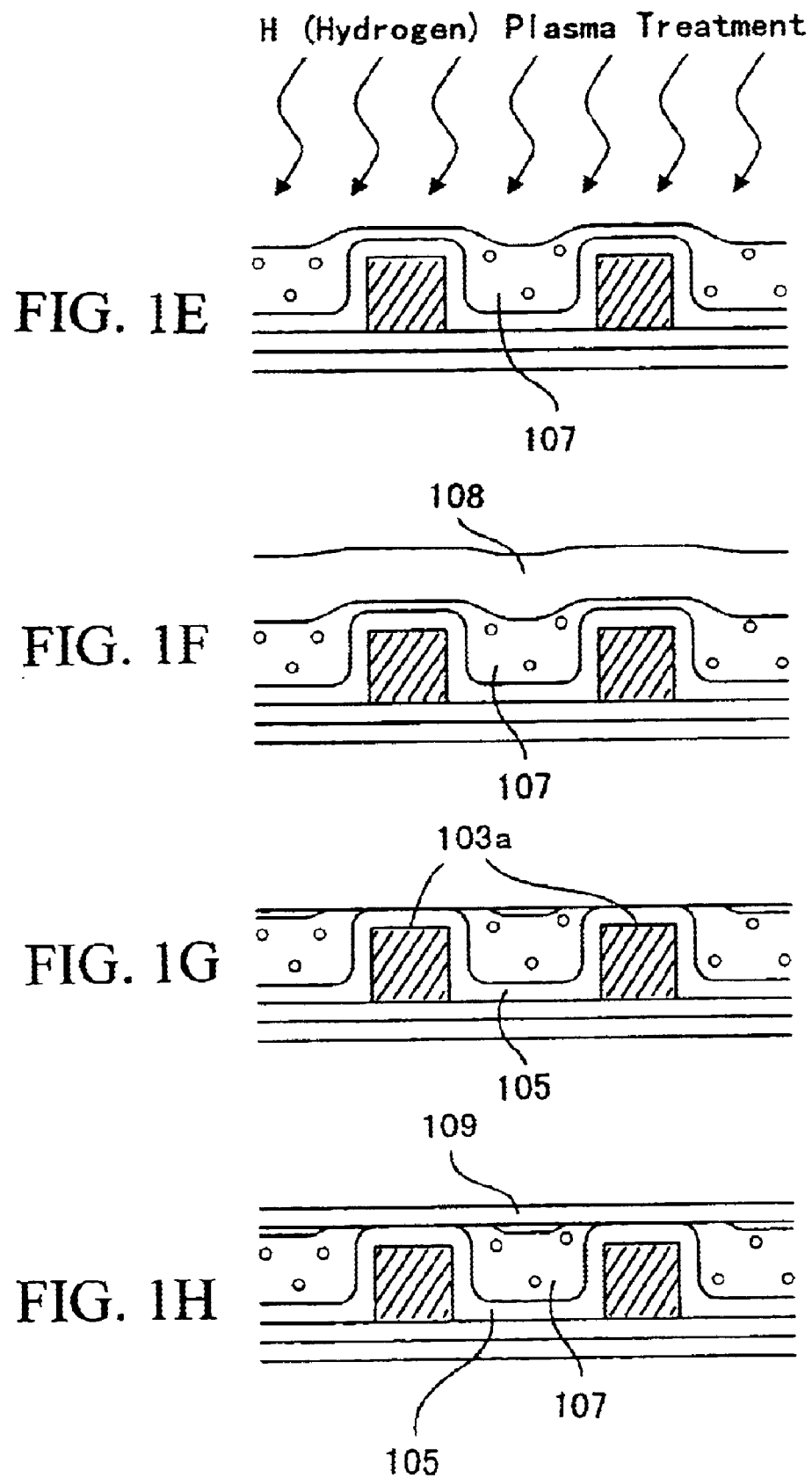

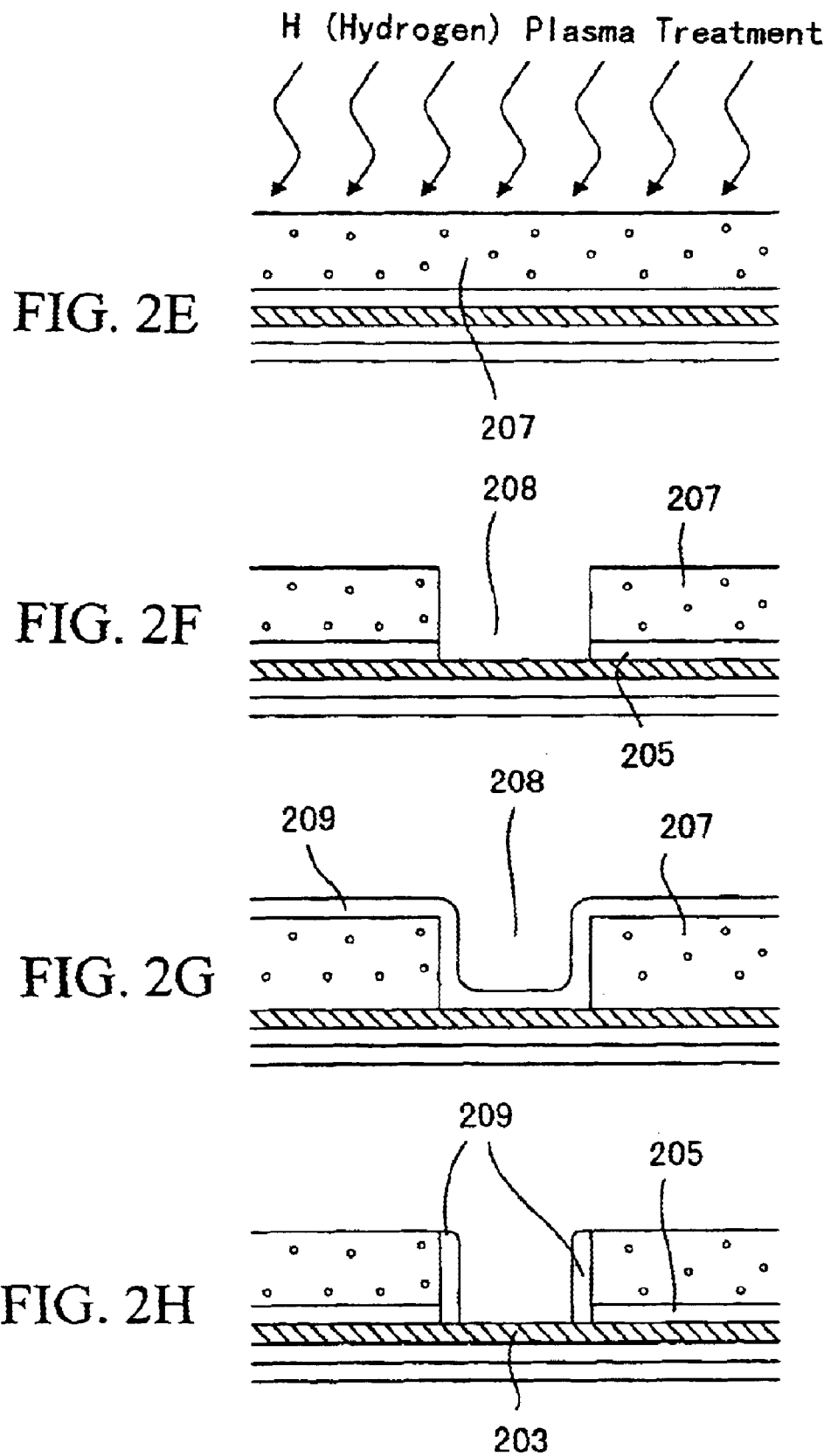

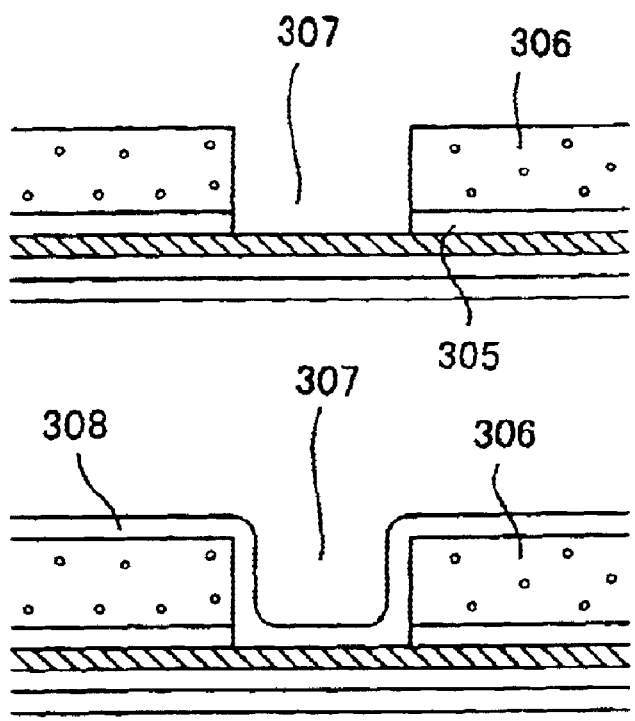
FIG. 3E
FIG. 3F
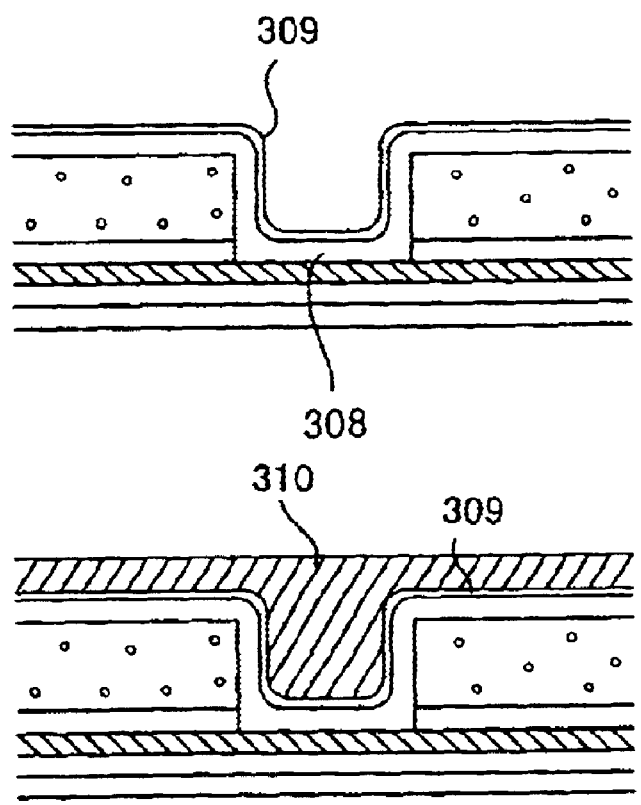
FIG. 3G
FIG. 3H

METHOD AND APPARATUS FOR FORMING AN INTERLAYER INSULATING FILM AND SEMICONDUCTOR DEVICE

BACKGROUND OF THE INVENTION

The present invention relates to a method for forming an interlayer insulating film and, more particularly, to a method for forming an interlayer insulating film having a low dielectric constant, which is necessary for a highly integrated semiconductor device. Progress in highly integrated semiconductor devices in recent years has resulted in a smaller spacing between wiring layers. Because reduction in the spacing between the wiring layers causes an increase in capacitance between the wiring layers, a need has been created for an interlayer insulating film having a low dielectric constant.

With recent progress in high integration of an LSI device, the wiring has been made finer and multilayered. There has also been an increase in capacitance between the wiring layers. Such an increase in capacitance has caused a great reduction in operating speed. Thus, improvement in this regard has been strongly needed. One method for reducing capacitance between the wiring layers uses an interlayer insulating film having a dielectric constant lower than that of the $SiO_2$ conventionally used for an interlayer insulating film.

Typical interlayer insulating films of low dielectric constants currently under study are (1) SiOF films, and (2) organic insulating films.

(1) SiOF Film

A SiOF film is formed by using a source gas containing F and substituting Si—F bonds for a portion of the Si—O bonds in $SiO_2$. This SiOF film has a relative dielectric constant which is monotonically reduced as concentration of F in the film increases.

For forming such SiOF films, several methods have been reported (see p.82 of the monthly periodical "Semiconductor World", February issue of 1996). Most promising among these methods is one using $SiH_4$, $O_2$, Ar and $SiF_4$ as source gases in a high-density plasma enhanced CVD method (HDPCVD method). The relative dielectric constant of an SiOF film formed by this method is in a range of 3.1 to 4.0 (varies depending on F concentration in the film). This value is lower than the relative dielectric constant 4.0 of $SiO_2$, which has conventionally been used for the interlayer insulating film.

(2) Organic Insulating Film of Low Dielectric Constant

Insulating films which have a lower dielectric constant (3.0 or lower) than a SiOF film are organic insulating films. Table 1 shows a few organic insulating films of low dielectric constants, which have been reported, and their respective relative dielectric constants and thermal decomposition temperatures.

TABLE 1

| Organic Insulating Film | Relative Dielectric Constant | Thermal Decomposition Temperature (° C.) | Note |
| --- | --- | --- | --- |
| Fluorine-containing resin | 2.4 | 420 | p. 82 of monthly periodical "Semiconductor World", February issue of 1997 |

TABLE 1-continued

| Organic Insulating Film | Relative Dielectric Constant | Thermal Decomposition Temperature (° C.) | Note |
| --- | --- | --- | --- |
| Cytop | 2.1 | 400 | p. 90 of monthly periodical "Semiconductor World", February issue of 1996 |
| Amorphous telon | 1.9 | 400 | p. 91 of monthly periodical "Semiconductor World", February issue of 1996 |

However, the SiOF film has the disadvantage that an increase in concentration of F in the film leads to a reduction in moisture absorption resistance. The reduced moisture absorption resistance poses a serious problem, because the transistor characteristic and adhesion to an upper barrier metal layer are adversely affected.

Peeling-off of the organic insulating film of a low dielectric constant easily occurs, because of poor adhesion to a silicon wafer or $SiO_2$ film. Furthermore, the organic insulating film has the disadvantage that its heat resistivity is low. Its thermal decomposition temperature is around 400° C. The disadvantage of low heat resistivity poses a problem for annealing a wafer at a high temperature.

SUMMARY OF THE INVENTION

It is an object of the present invention to provide a method for forming an interlayer insulating film having good moisture absorption resistance, good heat resistivity and a low dielectric constant, a semiconductor device using the interlayer insulating film, and a semiconductor manufacturing apparatus for forming the interlayer insulating film.

According to the method for forming the interlayer insulating film according to the present invention, as illustrated in FIG. 1C, the film is formed on a substrate by plasma enhanced chemical vapor deposition using a source gas (or a reaction gas) containing a Si—C—O—H compound, $O_2$ and $B_2H_6$, B (boron), C (carbon) and $H_2O$ are contained in the film thus formed. The inventor found that when this film is annealed using an O (oxygen) plasma, C (carbon) and $H_2O$ in the film are released from the film and thus many voids are created in the film, as illustrated in FIG. 1D. Thus, a porous $SiO_2$ film containing B (boron) can be formed on the substrate. When the film containing B (boron), C (carbon) and $H_2O$ is formed on the substrate, $H_2O$ contained in the film may enter into the substrate. This can be prevented in the following manner. That is, as illustrated in FIGS. 1B and 2B, an underlying insulating film is formed on the substrate, and then the film containing B (boron), C (carbon) and $H_2O$ is formed.

Moreover, the inventor found that when a film containing a C—O—H polymer is formed by plasma enhanced chemical vapor deposition using a source gas containing Si—C—O—H compound and $H_2$ (hydrogen) and this film is then annealed using the O (oxygen) plasma, a porous $SiO_2$ film can be formed in the same manner as described above. In this case, the C—O—H polymer contained in the film is oxidized by the O (oxygen) plasma, and thus the C—O—H polymer is released from the film, and consequently the voids are created in the film.

Furthermore, the inventor found that in forming a film containing the C—O—H polymer, if $O_2$ is added to the source, larger voids are created in the film, and the content of $SiO_2$ in the film increases and thus the film is stabilized.

Preferably, the film containing the C—O—H polymer has such a thinness that the C—O—H polymer is sufficiently oxidized by the O (oxygen) plasma. Therefore, the method of the present invention provides a porous $SiO_2$ film having a desired thickness by alternately repeating the formation of the film containing the C—O—H polymer and the oxidization by the O (oxygen) plasma, as illustrated in FIG. 3C.

The porous $SiO_2$ film formed as described above has many voids and thus has a surface area larger than the surface area of the $SiO_2$ film having no void. Because the porous $SiO_2$ film is prone to absorb moisture in the air it is subjected to H (hydrogen) plasma treatment as illustrated in FIGS. 1E, 2E, 3D and 3L. By this treatment, dangling Si—O bonds on the void surfaces are substituted with Si—H bonds. As a result, it is possible to prevent the moisture from being adsorbed on the surface of the voids. Furthermore, a cover insulating film is formed on the porous $SiO_2$ film as illustrated in FIGS. 1H and 2M, whereby it is possible to prevent moisture from being absorbed.

The semiconductor manufacturing apparatus according to the present invention has control means for controlling flow rate control means which, in turn, controls the flow rate of the source gas, and switching means for switching a high-frequency voltage applied to a chamber, as illustrated in FIG. 6.

The control means allows alternately repeating the plasma enhanced chemical vapor deposition and the annealing in one chamber, as illustrated in FIG. 4. That is, during a time period from T1 to T2 in FIG. 4, the source gases ($H_2$, TEOS (Tetra-Ethyl-Ortho-Silicate) and Ar) are introduced into the chamber and the high-frequency voltage is applied to the chamber, whereby plasma enhanced chemical vapor deposition takes place. During the time period from T2 to T3, $O_2$ is applied to the chamber, without the high-frequency voltage, whereby the annealing is performed in an atmosphere of $O_2$.

Furthermore, as illustrated in FIG. 5, this control means allows plasma enhanced chemical vapor deposition and annealing in a plasma atmosphere to be alternately repeated in one chamber. That is, during the time period from T1 to T2 in FIG. 5, the source gases ($H_2$, TEOS, $O_2$ and Ar) are introduced into the chamber and the high-frequency voltage is applied to the chamber, whereby the plasma enhanced chemical vapor deposition takes place. During the time period from T2 to T3, $O_2$ alone is introduced into the chamber which the high-frequency voltage is applied to, whereby the annealing is performed in the plasma atmosphere of $O_2$.

BRIEF DESCRIPTION OF THE DRAWINGS

FIGS. 1A to 1H are cross-sectional views showing a method for forming an interlayer insulating film according to a first embodiment of the present invention;

FIGS. 2A to 2M are cross-sectional views showing the method for forming the interlayer insulating film according to a second embodiment of the present invention;

FIGS. 3A to 3L are cross-sectional views showing the method for forming the interlayer insulating film according to third and fourth embodiments of the present invention;

DESCRIPTION OF THE PREFERRED EMBODIMENT

Figure 1A:
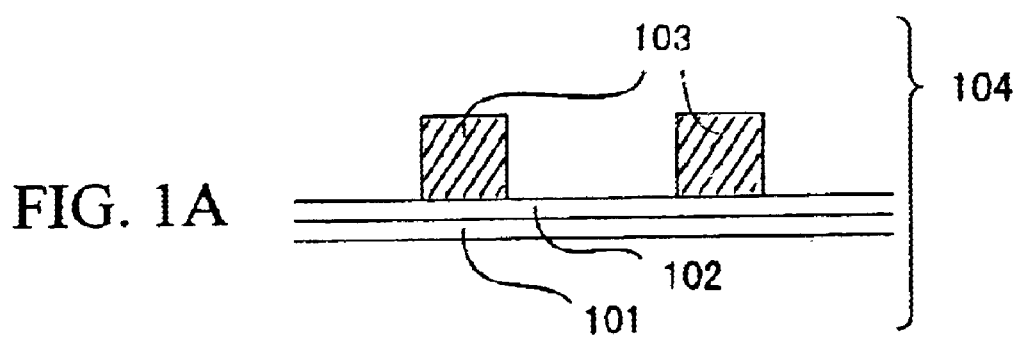

Preferred embodiments of the present invention will now be described with reference to the accompanying drawings.
(a) First Embodiment of the Method Referring to FIGS. 1A to 1H, first, as shown in FIG. 1A, a BPSG (borophosphosilicate glass) film 102 is formed on a silicon substrate 101. Then, an aluminum film is formed on the BPSG film 102 and then the aluminum film is patterned, whereby an aluminum wiring layer 103 is formed. A substrate 104 comprises the silicon substrate 101, the BPSG film 102 and the aluminum wiring layer 103 which are formed in the foregoing manner.

Figure 1B:
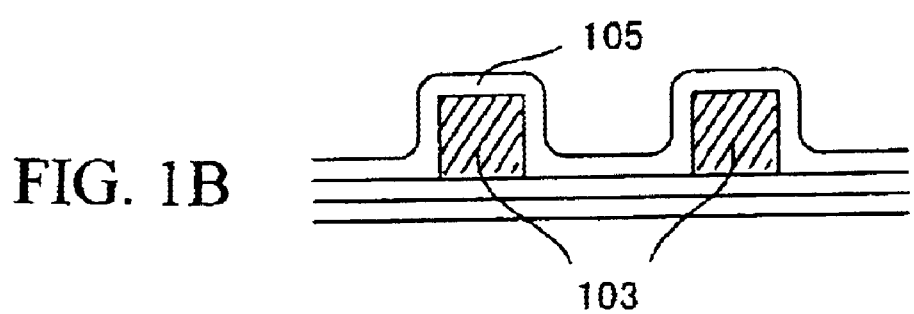

Then, as shown in FIG. 1B, a $SiO_2$ film 105 (an underlying insulating film) is formed on the substrate 104. This $SiC)_2$ film 105 is formed by a PECVD method (plasma enhanced chemical vapor deposition). $SiH_4$ and $N_2O$ am used as a source gas. The thickness of the $SiO_2$ film 105 is 100 nm.

Figure 1C:
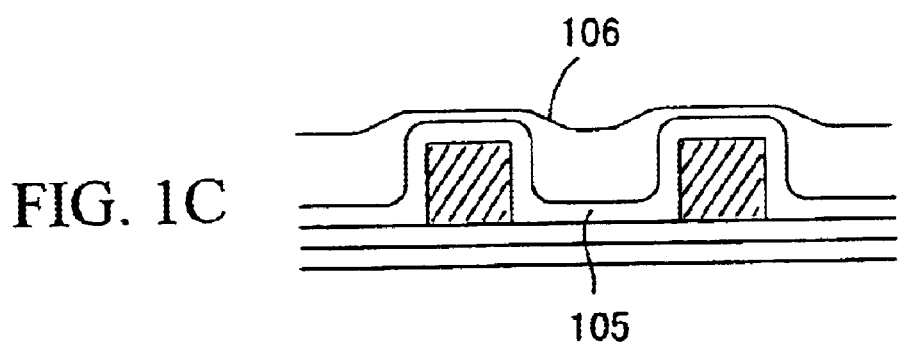

Then, as shown in FIG. 1C, a $SiO_2$ film 106 having a thickness of 500 nm and containing B (boron) is formed on the $SiO_2$ film 105 (the underlying insulating film). The $SiO_2$ film 106 containing B (boron) is formed by a CVD method (Enhanced chemical vapor deposition) under a pressure of 1 Torr by applying RF power having a frequency of 13.56 MHz with the silicon substrate 101 kept at 100° C. in an atmosphere of TEOS (Tetra-Ethyl-Ortho-Silicate), $B_2H_4$, $O_2$ and Ar. C (carbon) and an OH group as well as B are contained in the B-(boron)-containing $SiO_2$ film 106 formed in this manner. In this case, the flow rates of the source gases are as follows: the flow rate of TEOS is 30 sccm, the flow rate of $B_2H_6$ is 30 sccm, the flow rate of $O_2$ is 90 sccm, and the flow rate of Ar is 900 sccm.

Figure 1D:
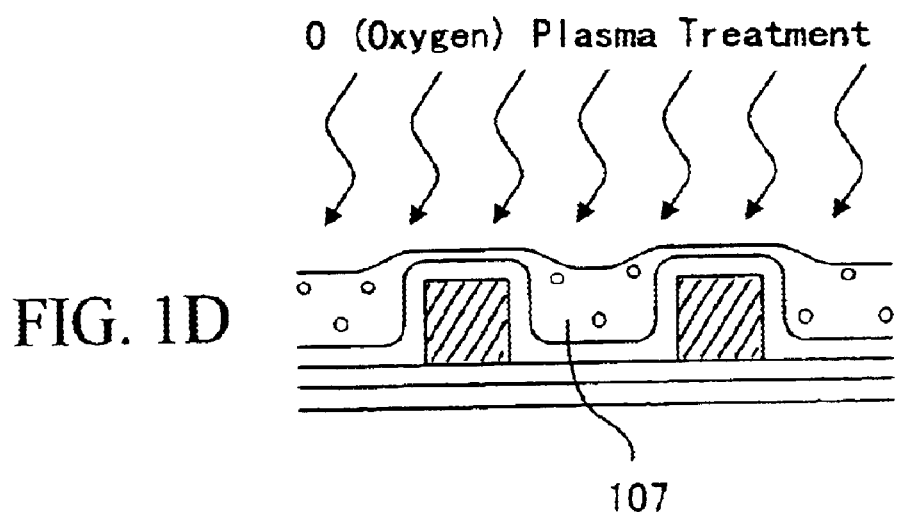

Then, as shown in FIG. 1D, the $SiO_2$ film 106 containing B (boron) is subjected to O (oxygen) plasma treatment At this time, C (carbon) and the OH groups contained in the $SiO_2$ film 106 containing B (boron) react with O atoms in O (oxygen) plasma. Thus, C (carbon) and the OH groups are changed to $CO_2$ and $H_2O$, and then $CO_2$ and $H_2O$ are released from the film thereby creating voids at sites which have contained C (carbon) and the OH groups in the $SiO_2$ film 106 containing B (boron) and consequently, changing the $SiO_2$ film 106 containing B (boron) to a porous $SiO_2$ film 107 containing B (boron).

Subsequently, as shown in FIG. 1E, the porous $SiO_2$ film 107 containing B (boron) is subjected to H (hydrogen) plasma treatment. By this treatment, dangling Si—O bonds in the film are substituted with Si—H bonds. Thus, the film is improved in moisture absorption resistance.

Then, as shown in FIG. 1F, an $SiO_2$ film 108 is formed on the porous $SiO_2$ film 107 containing B (boron). This $SiO_2$ film 108 is formed in order to planarize the surface. The $SiO_2$ film 108 is formed by the CVD method using TEOS and $O_3$ as the source gas. The $O_3$ has sufficient density to oxidize TEOS. Thus, the $SiO_2$ film 108 is a fluidized $SiO_2$ film.

Then, as shown in FIG. 1G, the $SiO_2$ film 108 is etched, whereby the surface is planarized. At this time, the $SiO_2$ film (the underlying insulating film) 105 and the porous $SiO_2$ film 107 containing B (boron), which are previously fed, are partly removed by etching. The planarizing by the etching is limited so that the $SiO_2$ film 105 formed on a convexity 103a of the aluminum wiring layer is not completely removed.

Then, as shown in FIG. 1H, a $SiO_2$ film (a cover insulating film) 109 is formed on the planarized surface. This $SiO_2$ film 109 is formed by the PECVD method. $SiH_4$ and $N_2O$ are used as the source gas. The thickness of the $SiO_2$ film 109 is 100 nm.

The interlayer insulating film having good heat resistivity, good moisture absorption resistance and a low dielectric constant is formed on the substrate 104 by the $SiO_2$ film (the underlying insulating film) 105, the $SiO_2$ film 108, the $SiO_2$ film (the cover insulating film) 109 and the porous $SiO_2$ film 107 containing B (boron) which are formed as described above. That is, the $SiO_2$ film 107 containing B (boron) is porous, and thus the dielectric constant of the $SiO_2$ film 107 is 2.0 to 3.0. This dielectric constant is lower than the dielectric constant 4.0 of a typical nonporous $SiO_2$ film. Moreover, the typical $SiO_2$ film 109 is formed on the porous $SiO_2$ film 107 containing B (boron). Thus, it is possible to prevent moisture from penetrating into the $SiO_2$ film 107 containing B (boron). Furthermore, the heat resistivity of the $SiO_2$ film 105, 108, 109 and the porous $SiO_2$ film 107 containing B (boron) is better than the heat resistivity of an organic insulating film.

Though TEOS (Tetra-Ethyl-Ortho-Silicate) is used as the Si—C—O—H compound in the above embodiment, Tri-methoxy-silane ($Si(OCH_3)_3)H$) or the like may be used. That is, any compound of the general formula $Si(OR)nH_{4-n}$ ($R=CH_3$ or $C_2H_5$, n=1 to 3) may be used as the Si—C—O—H compound. This is also true in the following embodiments.

(b) Second Embodiment

The second embodiment applies the first embodiment to a damascene process.

Figure 2A:
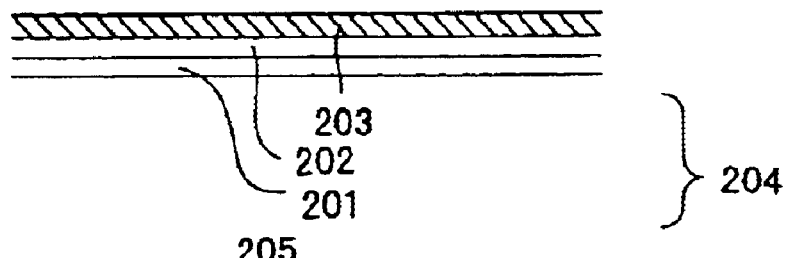

Referring to FIGS. 2A to 2M, first as shown in FIG. 2A, a BPSG (borophosphosilicate glass) film 202 is formed on a silicon substrate 201. An aluminum layer is formed on the BPSG film 202 and then the aluminum layer is patterned, whereby an aluminum wiring layer 203 is formed. A substrate 204 comprises the silicon substrate 201, the BPSG film 202 and the aluminum wiring layer 203.

Figure 2B:
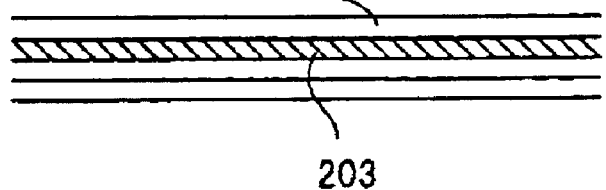

Then, as shown in FIG. 2B, a $SiO_2$ film (the underlying insulating film) 205 having a thickness of 100 nm is formed on the aluminum wiring layer 203. This $SiO_2$ film 205 is formed by the PECVD method (plasma enhanced chemical vapor deposition). $SiN_4$ and $N_2O$ are used as the source gas.

Figure 2C:
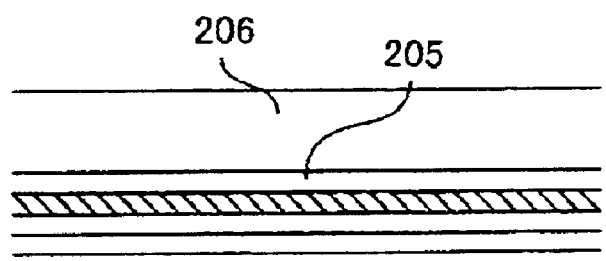

Then, as shown in FIG. 2C, a $SiO_2$ film 206 having a thickness of 500 nm and containing B (boron) is formed on the $SiO_2$ film (the underlying insulating film) 205. The $SiO_2$ film 206 containing B (boron) is formed by the CVD method (plasma enhanced chemical vapor deposition) under a pressure of 1 Torr by applying RF power at a frequency of 13.56 MHz and RF power at a frequency of 400 kHz with the silicon substrate 201 kept at 100° C. in the atmosphere of TEOS (Tetra-Ethyl-Ortho-Silicate), $B_2H_6$, $O_2$ and Ar. C (carbon) and the OH group as well as B are contained in the B-(boron)-containing $SiO_2$ film 206 formed in this way.

Figure 2D:
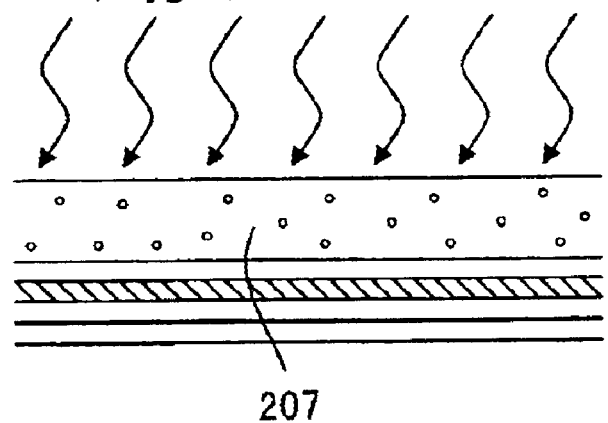

Then, as shown in FIG. 2D, the $SiO_2$ film 206 containing B (boron) is subjected to the O (oxygen) plasma treatment after the temperature of the silicon substrate 201 is raised to 400° C. At this time, C (carbon) and the OH groups contained in the $SiO_2$ film 206 containing B (boron) react with the O atoms in the O (oxygen) plasma. Thus, C (carbon) and the OH groups are changed to $CO_2$ and $H_2O$, and then $CO_2$ and $H_2O$ are released from the film thereby creating voids at the sites which have contained C (carbon) and the OH group in the $SiO_2$ film 206 containing B (boron). Consequently, the $SiO_2$ film 206 containing B (boron) is changed to a porous $SiO_2$ film 207 containing B (boron).

Subsequently, as shown in FIG. 2E, the porous $SiO_2$ film 207 containing B (boron) is subjected to the H (hydrogen) plasma treatment. By this treatment, the dangling Si—O bonds in the film are substituted with Si—H bonds. Thus, the film is improved in the moisture absorption resistance.

Then, as shown in FIG. 2F, the $SiO_2$ film (the underlying insulating film) 205 and the porous $SiO_2$ film 207 containing B (boron) are patterned to form a damascene trench 208. This damascene trench 208 communicates with the aluminum wiring layer 203 formed under the $SiO_2$ film 205.

Then, as shown in FIG. 2G, an $SiO_2$ film (a first insulating film) 209 is formed on the porous $SiO_2$ film 207 containing B (boron) and on the sides and bottom of the damascene trench 208. This $SiO_2$ film 209 is formed by the PECVD method (plasma enhanced chemical vapor deposition). The $SiO_2$ film 209 formed on the sides of the damascene trench 208 can prevent Cu, to be later formed in the damascene trench 208, from diffusing into the porous $SiO_2$ film 207 containing B (boron).

Then, as shown in FIG. 2H, the $SiO_2$ film (the first insulating film) 209 is anisotropically etched. This results in removing the $SiO_2$ film 209 other than that portion on the sides of the damascene trench 208. A contact hole communicating with the aluminum wiring layer 203 is formed in the bottom of the damascene trench 208.

Figure 2I:
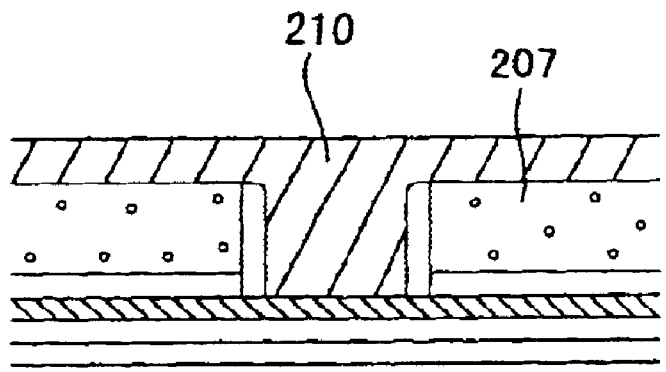

Subsequently, as shown in FIG. 2I, a Cu-plated film 210 is formed in the damascene trench 208 and on the porous $SiO_2$ film 207 containing B (boron). The Cu-plated film 210 formed in the damascene trench 208 is used as Cu wiring.

Figure 2J:
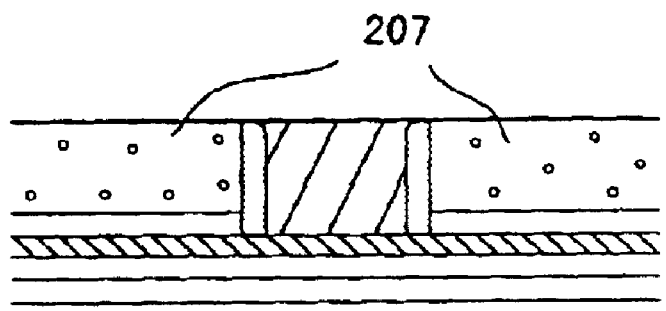

Then, as shown in FIG. 2J, the Cu-plated film 210 formed on the porous $SiO_2$ film 207 containing B (boron) is polished and removed by CMP (Chemical Mechanical Polishing). Thus, the Cu-plated film remains only in the damascene trench 208.

Figure 2K:
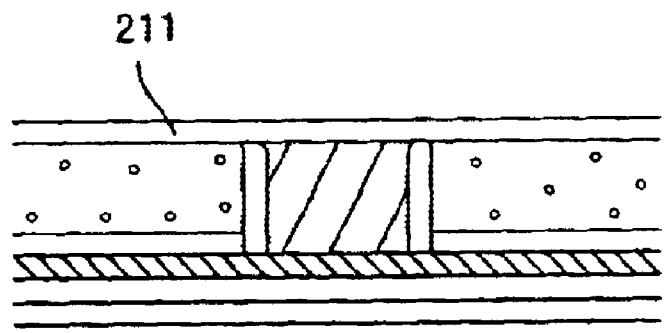

Then, as shown in FIG. 2K, a TiN film 211 for a barrier is formed on the damascene trench 208. This TiN film 211 can prevent Cu in the damascene trench 208 from diffusing into the $SiO_2$ film to be later formed on the damascene trench 208.

Figure 2L:
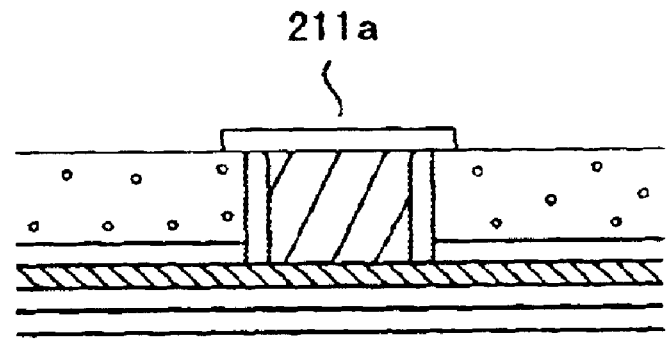

Then, as shown in FIG. 2L, the patterning leaves a Tin 10 film 211a formed on the damascene trench 208 and etches away the TiN film 211 formed on the other portions.

Figure 2M:
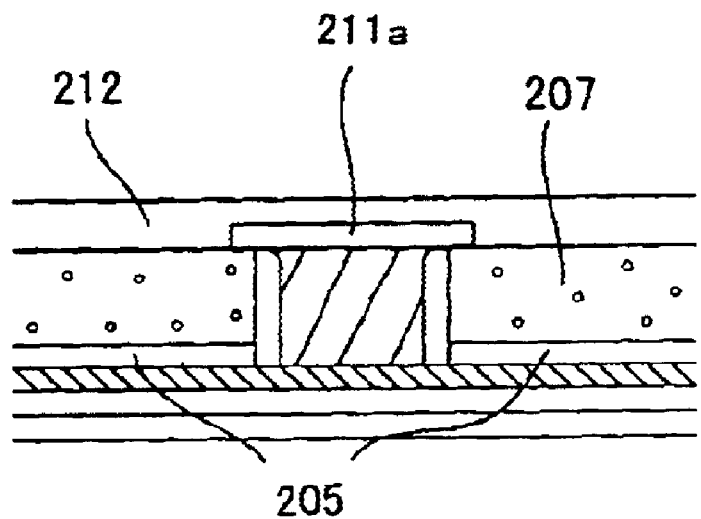

Subsequently, as shown in FIG. 2M, a $SiO_2$ film (the cover insulating film) 212 is formed on the $SiO_2$ film 207 containing B (boron) and the TiN film 211a. This $SiO_2$ film 212 is formed by the PECVD method. $SiH_4$ and $N_2O$ are used as the source gas.

As described above, the interlayer insulating film having good heat resistivity, good moisture absorption resistance and a low dielectric constant is formed on the substrate 204. That is, the $SiO_2$ film 207 containing B (boron) is porous, and thus the dielectric constant of the $SiO_2$ film 207 is lower than that of a typical B-containing $SiO_2$ film(a BSG film). Moreover, the typical $SiO_2$ film (the cover insulating film) 212 is formed on the porous $SiO_2$ film 207 containing B (boron) to prevent the moisture from penetrating into the porous $SiO_2$ film 207. Furthermore, the heat resistivity of the porous $SiO_2$ film 207 containing B (boron) is better than the heat resistivity of an organic insulating film.

(c) Third Embodiment

Figure 3A:
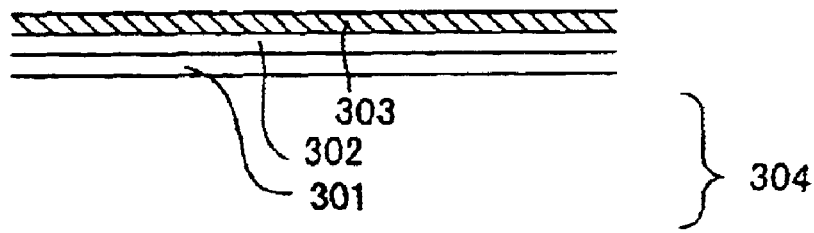

Referring to FIGS. 3A to 3L, first, as shown in FIG. 3A, a BPSG (borophosphosilicate glass) film 302 is formed on a silicon substrate 301. The aluminum layer is formed on the BPSG film 302 and then the aluminum layer is patterned, whereby an aluminum wiring layer 303 is formed. A substrate 304 comprises the silicon substrate 301, the BPSG film 302 and the aluminum wiring layer 303.

Figure 3B:
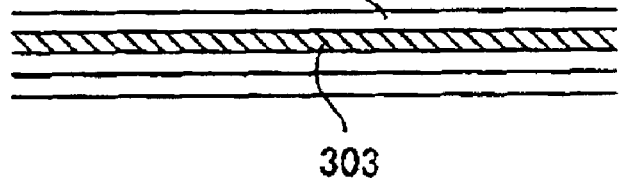

Then, as shown in FIG. 3B, a $SiO_2$ film (the underlying insulating film) 305 is formed on the aluminixn wiring layer 303. This $SiO_2$ film 305 is formed by the PECVD method (plasma enhanced chemical vapor deposition). $SiH_4$ and $N_2O$ are used as the source gas.

Figure 3C:
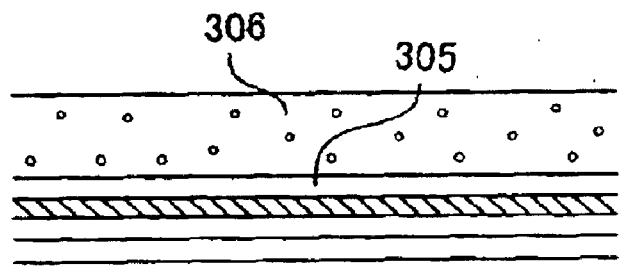
Figure 4:
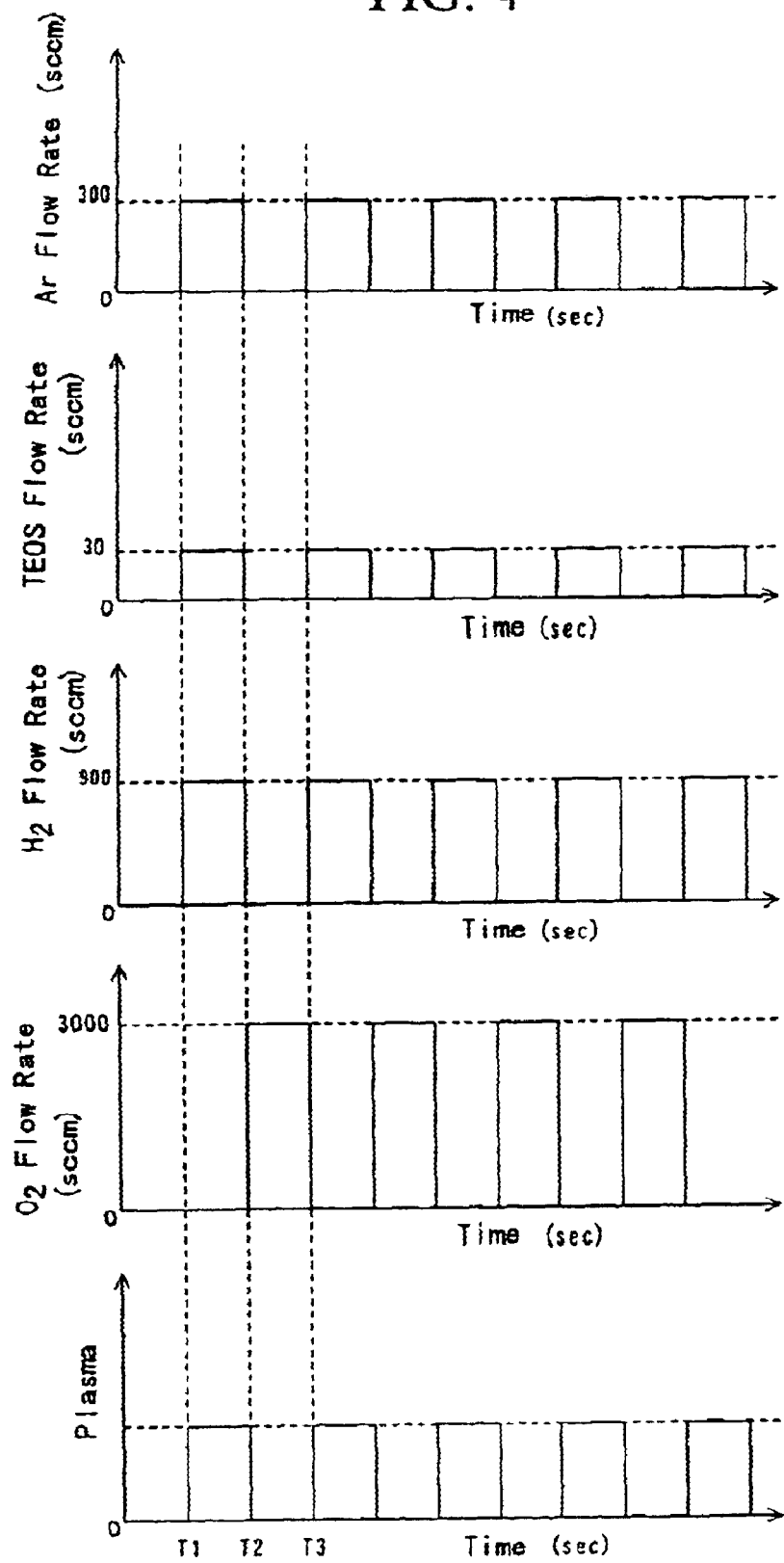
FIG. 4 shows characteristics of time dependency of an Ar flow rate, a TEOS flow rate, an $H_2$ flow rate, an $O_2$ flow rate and plasma in the method for forming the interlayer insulating film according to the third embodiment of the present invention and a semiconductor manufacturing apparatus.

Then, as shown in FIG. 3C, a porous $SiO_2$ film 306 is formed on the $SiO_2$ film (the underlying insulating film) 305. This porous $SiO_2$ film 306 is formed by using the plasma changing with the passage of time as shown in FIG. 4 in the atmosphere of TEOS (Tetra-Ethyl-Ortho-Silicate), with the flow rates of $H_2$, Ar, TEOS and $O_2$ also changing with the passage of time as shown in FIG. 4 and with the silicon substrate 301 kept at 350° C. During the time period from T1 to T2 in FIG. 4, the plasma is generated in an atmosphere of TEOS and $H_2$, so that the process of the PECVD (plasma enhanced chemical vapor deposition) takes place. At this time, the pressure is 1.0 Torr. The film formed at this time contains many C—O—H polymers and has a network structure composed of a large number of $SiO_2$ molecules. During the time period from T2 to T3 in the drawing, the plasma is not generated, so that annealing takes place in an atmosphere of $O_2$. At this time, the pressure is 0.1 Torr. By this annealing, the C—O—H polymers contained in the film formed during the time period from T1 to T2 are oxidized by $O_2$ and then the C—O—H polymers are released from the film. Thus, only the network structure of $SiO_2$ remains in the film, and therefore many voids are create in the film. In order to sufficiently oxidize the C—O—H polymers, it is desirable that the thickness of the film containing the C—O—H polymers be small, which is accomplished by setting a small interval between T2 and T1.

The porous $SiO_2$ film 306 is formed by repeating the PECVD in the atmosphere of TEOS, $H_2$ and Ar and the annealing in the atmosphere of $O_2$ as described above.

In this embodiment, the RF power with a frequency of 13.56 MHz and the RF power with a frequency of 400 kHz are used as the RF power for generating the plasma. The respective RF powers are 300 W and 50 W. In FIG. 4, T1=5 sec, T2=10 sec and T3=15 sec.

Figure 3D:
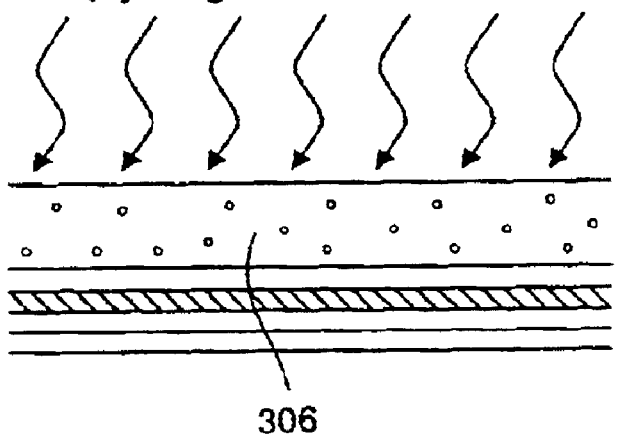

Then, as shown in FIG. 3D, the porous $SiO_2$ film 306 is subjected to the H (hydrogen) plasma treatment. By this treatment, the dangling Si—O bonds on the inner surfaces of the voids are replaced by the Si—H bonds. Thus, the film improves in the moisture absorption resistance.

Subsequently, as shown in FIG. 3E, the $SiO_2$ film (the underlying insulating film) 305 and the porous $SiO_2$ film 306 are opened by patterning, whereby a damascene trench 307 is formed. This damascene trench 307 reaches to the aluminum wiring layer 303 formed under the $SiO_2$ film 305.

Then, as shown in FIG. 3F, a TiN film 308, serving as a barrier, is formed on the porous $SiO_2$ film 306 and on the sides and bottom of the damascene trench 307. This TiN film 308 can prevent the Cu-plated film, to be later formed in the damascene trench 307, from diffusing around the damascene trench 307.

Then, as shown in FIG. 3G, a Cu seed layer 309 is formed on the TiN film 308. This Cu seed layer 309 is used as a conductive layer for supplying a current to form the Cu-plated film on the Cu seed layer 309.

Then, as shown in FIG. 3H, a Cu-plated film 310 is formed on the Cu seed layer 309, and Cu is buried in the damascene trench 307.

Figure 3I:
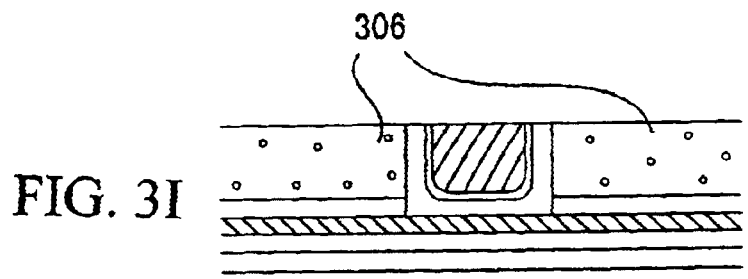

Subsequently, as shown in FIG. 3I, the TiN film 308 formed on the porous $SiO_2$ film 306, the Cu seed layer 309 and the Cu-plated film 310 are polished and rezinved by the CMP method (Chemical Mechanical Polishing method). Thus, the Cu-plated film remains only in the damascene trench 307.

Figure 3J:
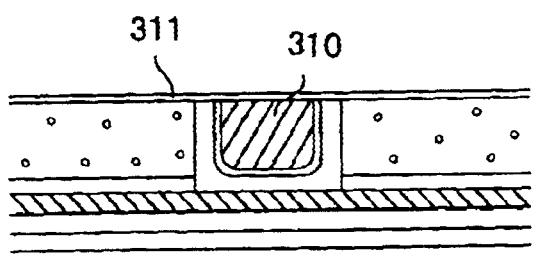

Then, as shown in FIG. 3J, an SiN film 311 for preventing Cu from oxidizing is formed on the Cu-plated film 310 polished by the CMP method. Desirably, an anti-oxidizing film such as the SiN film is formed as soon as possible after the polishing by the CMP method, because Cu is prone to be oxidized compared to Al.

Figure 3K:
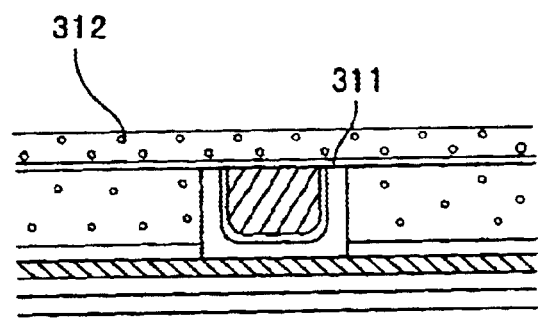

Then, as shown in FIG. 3K, a porous $SiO_2$ film 312 is formed on the SiN film 311. This porous $SiO_2$ film 312 is formed in the same manner as the porous $SiO_2$ film 306 previously formed. That is, the porous $SiO_2$ film 312 is formed by using the plasma changing with the passage of time as shown in FIG. 4 wherein the flow rates of TEOS, $H_2$, Ar and $O_2$ change with passage of time as shown in FIG. 4 with the silicon substrate 301 kept at 350° C. The RF power with a frequency of 13.56 MHz and the RF power with a frequency of 400 kHz are used as the RF power for use in this case. The respective powers are 300 W and 50 W. In FIG. 4, T1=5 sec, T2=10 sec and T3=15 sec.

Figure 3L:
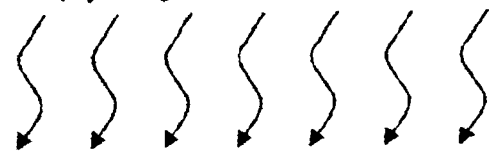
Figure 3L:
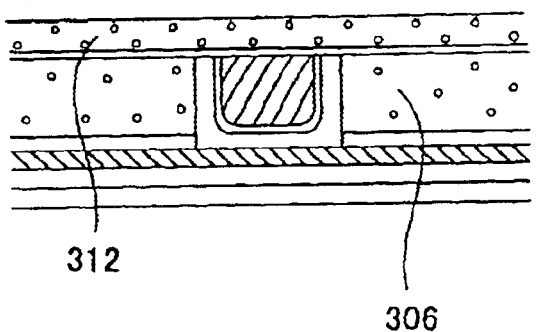

Then, as shown in FIG. 3L, the porous $SiO_2$ film 312 is subjected to the H (hydrogen) plasma treatment. By this treatment, the dangling Si—O bonds on the inner surfaces of the voids are replaced by the Si—H bonds. Thus, the moisture absorption resistance of the film is improved.

As described above, the interlayer insulating film having good heat resistivity, good moisture absorption resistance and a low dielectric constant is formed on the substrate 304. That is, the $SiO_2$ films 306 and 312 are porous, and thus the dielectric constant of these films is 2.0 to 3.0. This dielectric constant is lower than the dielectric constant of the typical nonporous $SiO_2$ film. Moreover, the porous $SiO_2$ films 306 and 312 are subjected to the H (hydrogen) plasma treatment. Thus, the moisture absorption resistance of the films is improved. Additionally, the heat resistivity of the porous $SiO_2$ films 306 and 312 is better than the heat resistivity of the organic insulating films.

(d) Fourth Embodiment

The fourth embodiment differs from the third embodiment only in the method for forming the porous $SiO_2$ film. First, as shown in FIG. 3A, the BPSG 20 (borophosphosilicate glass) film 302 is formed on the silicon substrate 301. The aluminum layer is formed on the BPSG film 302 and then the aluminum layer is patterned, whereby the aluminum wiring layer 303 is formed. The substrate 304 comprises the silicon substrate 301, the BPSG film 302 and the aluminum wiring layer 303.

Then, as shown in FIG. 3B, the $SiO_2$ film 305 (the underlying insulating film) is formed on the aluminum wiring layer 303. This $SiO_2$ film 305 is formed by the PECVD method (plasma enhanced chemical vapor deposition). $SiH_4$ and $N_2O$ are used as the source gas.

Then, as shown in FIG. 3C, the porous $SiO_2$ film 306 is formed on the $SiO_2$ film (the underlying insulating film) 305. This porous $SiO_2$ film 306 is formed by using the plasmas with the flow rates changing with the passage of time as shown in FIG. 5, with the silicon substrate 301 kept at 350° C.

The fourth embodiment differs from the third embodiment in that the plasma does not change with the passage of time and thus a plasma having a fixed intensity is generated during film formation and in that $O_2$ is added to the atmosphere of TEOS, $H_2$ and Ar during the film formation.

Figure 5:
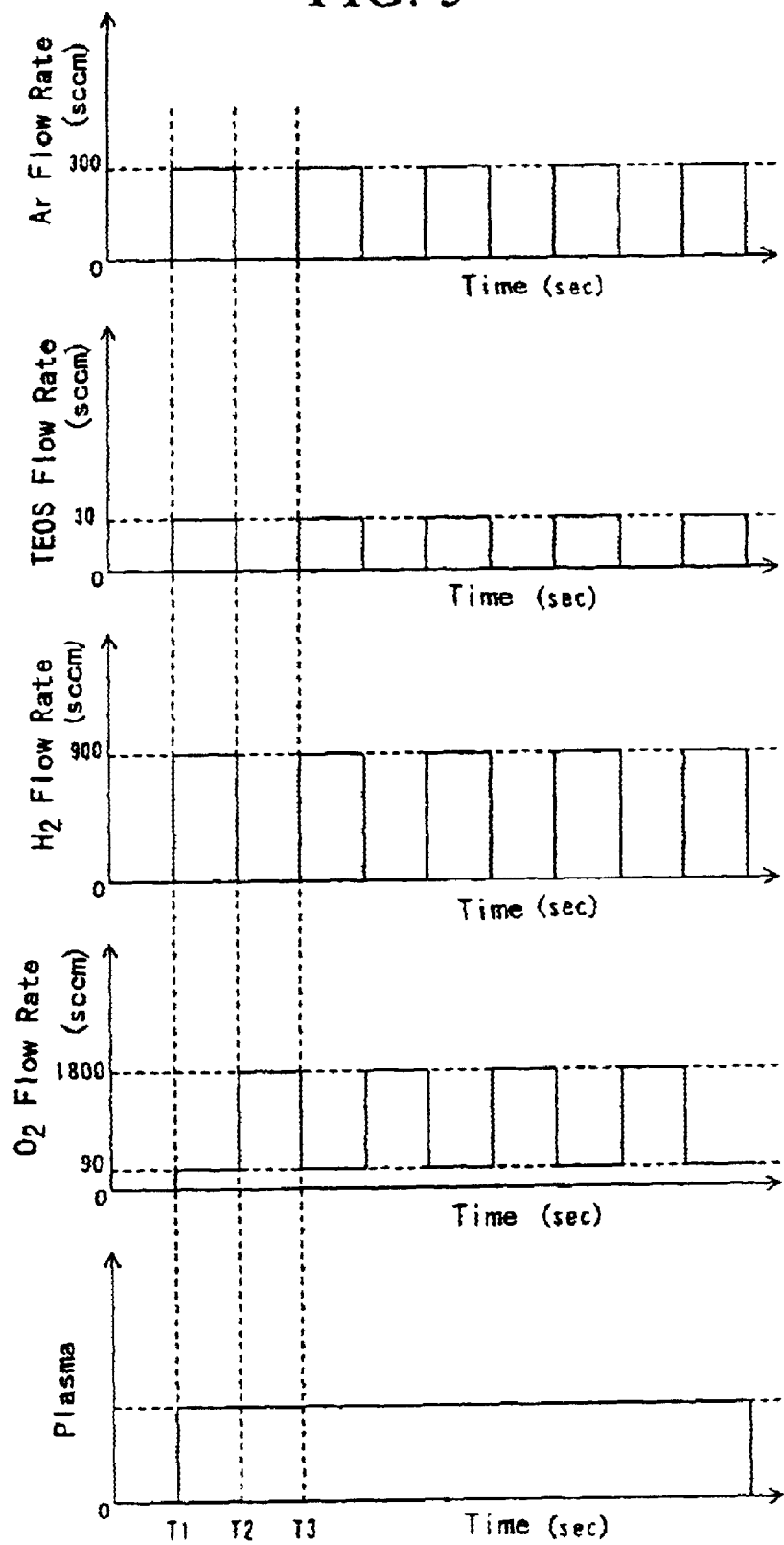
FIG. 5 shows the characteristics of the time dependency of the Ar flow rate, the TEOS flow rate, the $H_2$ flow rate, the $O_2$ flow rate and the plasma in the method for forming the interlayer insulating film according to the fourth embodiment of the present invention and the semiconductor manufacturing apparatus.

During the time period from T1 to T2 in FIG. 5, the plasma CVD (plasma enhanced chemical vapor deposition) takes place in the atmosphere of TEOS, $H_2$, Ar and $O_2$. At this time, the pressure is 1.0 Torr. Many C—O—H polymers are contained in the film formed at this time. Because of $O_2$ added to the atmosphere, the content of $SiO_2$ in the film is higher than the content of $SiO_2$ of the third embodiment. Thus, the film is improved in stability. Decomposition reaction of OH allows the larger network structure of $SiO_2$ to be formed.

Moreover, during the time period from T1 to T3 in FIG. 5, the annealing takes place in an atmosphere of $O_2$ plasma. At this time, the pressure is 0.1 Torr. When the annealing occurs in the $O_2$ plasma in this manner, outgassing from the film improves compared to the outgassing by annealing in the $O_2$ atmosphere in the third embodiment. By this annealing, the C—O—H polymers contained in the film formed during the time period from T1 to T2 are oxidized by $O_2$, and then the C—O—H polymers are released from the film. Thus, only the network structure of $SiO_2$ remains in the film, and many voids are created in the film. The size of the void created in this fourth embodiment is larger than the size of the void of the third embodiment. In order to sufficiently oxidize the C—O—H polymers, it is desirable that the thickness of the film containing the C—O—H polymers be sufficiently small due to a short interval between T2 and T1.

The porous $SiO_2$ film 306 is formed by repeating the plasma CVD in the atmosphere of TEOS, $H_2$, Ar and $O_2$ and the annealing in the $O_2$ plasma as described above.

In this embodiment the RF power with a frequency of 13.56 MHz and the RF power with a frequency of 400 kHz are used in order to generate the plasma. The respective RF powers are 300 W and 50 W. In FIG. 5, T1=5 sec, T2=10 sec and T3=15 sec.

Then, as shown in FIG. 3D, the porous $SiO_2$ film 306 is subjected to the H (hydrogen) plasma treatment. By this treatment, the dangling Si—O bonds on the inner surfaces of the voids are replaced by the Si—H bonds. Thus, the film is improved in moisture absorption resistance.

Subsequently, as shown in FIG. 3E, a damascene trench 307 is formed in the $SiO_2$ film 305 (the underlying insulating film) and the porous $SiO_2$ film 306. This damascene trench 307 communicates with the aluminum wiring layer 303 formed under the $SiO_2$ film 305.

Then, as shown in FIG. 3F, the TiN film 308 for the barrier metal is formed on the porous $SiO_2$ film 306 and on the sides and the bottom of the damascene trench 307. This TiN film 308 prevents the Cu-plated film subsequently formed in the damascene trench 307 from diffusing from the damascene trench 307.

Then, as shown in FIG. 3G, the Cu seed layer 309 is formed on the TiN film 308. This Cu seed layer 309 is used as the conductive layer for supplying the current to form the Cu-plated film on the Cu seed layer 309.

Then, as shown in FIG. 3H the Cu-plated film 310 is formed on the Cu seed layer 309, and the damascene trench 307 is filled with Cu.

Subsequently, as shown in FIG. 3I, the TiN film 30E formed on the porous $SiO_2$ film 306, the Cu seed layer 309 and the Cu-plated film 310 are polished and removed by the CMP method (Chemical Mochanical Polishing method). Thus, the Cu-plated film remains only in the damascene trench 307.

Then, as shown in FIG. 3J, a SiN film 311 for preventing Cu from oxidizing is formed on the Cu-plated film 310 polished by the CMP method. Preferably, the anti-oxidizing film such as the SiN film is formed as soon as possible after the polishing by the CMP method, because Cu is more prone to be oxidized than Al.

Then, as shown in FIG. 3K, the porous $SiO_2$ film 312 is formed on the SiN film 311. This porous $SiO_2$ film 312 is formed in the same manner as the porous $SiO_2$ film 306 previously described. That is, the porous $SiO_2$ film 312 is formed by using a pulsed plasma as shown in FIG. 5 in an atmosphere of TEOS, $H_2$, Ar and $O_2$, having flow rates changing with time as also shown in FIG. 5, with the silicon substrate 301 kept at 350° C. The RP power with a frequency of 13.56 MHz and the RF power with a frequency of 400 kHz are used as the RF power in this embodiment. The respective RF powers are 300 W and 50 W. In FIG. 5, T1=5 sec, T2=10 sec and T3=15 sec.

Then, as shown in FIG. 3L, the porous $SiO_2$ film 312 subjected to the H (hydrogen) plasma treatment. By this treatment, the dangling Si—O bonds on the inner surfaces of the voids are replaced by Si—H bonds. The film is thus improved in moisture absorption resistance.

As described above, the interlayer insulating film having good heat resistivity, good moisture absorption resistance and low dielectric constant is formed on the substrate 304. That is, the size of the voids in the porous $SiO_2$ films 306 and 312 is larger the size of the voids of the third embodiment. Thus, the dielectric constant of the porous $SiO_2$ films 306 and 312 is 2.0 to 2.5. This dielectric constant is even lower than the dielectric constant of the third embodiment. The porous $SiO_2$ films 306 and 312 are subjected to the H (hydrogen) plasma treatment to improve the moisture absorption resistance of the film. Furthermore, the heat resistivity of the porous $SiO_2$ films 306 and 312 is better than the heat resistivity of the organic insulating films.

Although, the annealing methods according to the third and fourth embodiments are applied to an interlayer insulating film not containing B, they may also be applied to the interlayer insulating films 106, 206 containing B in the first and second embodiments. Conversely, the annealing methods according to the first and second embodiments may be applied to the interlayer insulating film not containing B in the third and fourth embodiments.

(2) Description of an Apparatus for Forming the Interlayer Insulating Film

According to the Present Invention

The apparatus for forming the interlayer insulating film will now be described with reference to FIGS. 4, 5 and 6.

Figure 6:
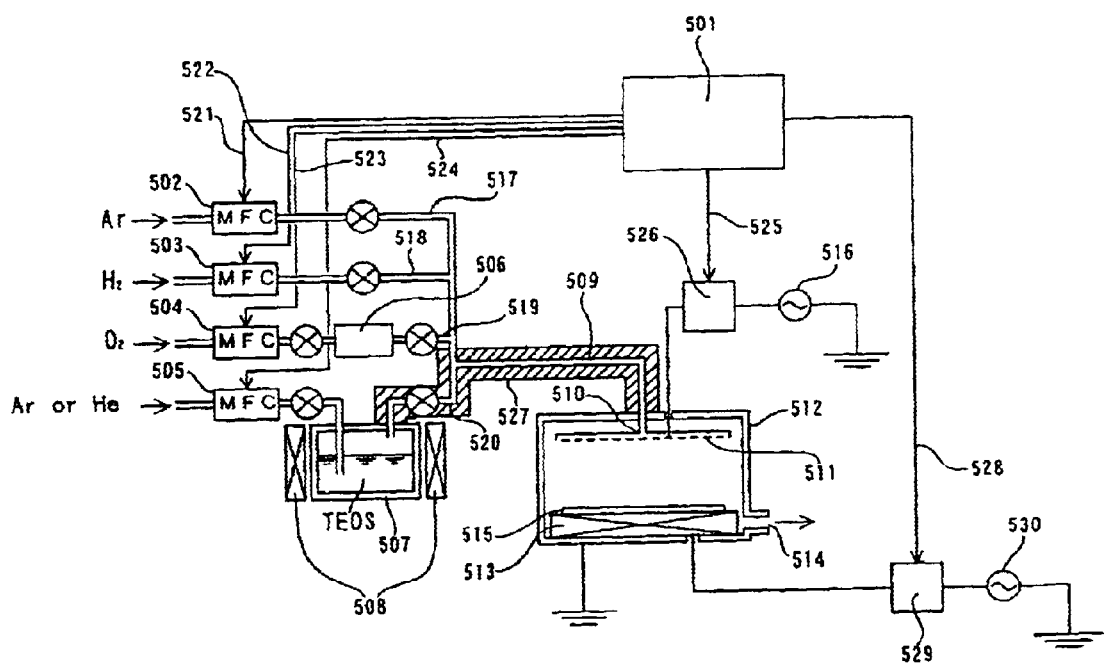
FIG. 6 shows a semiconductor manufacturing apparatus according to an embodiment of the present invention.

FIG. 6 shows the basic structure of an apparatus for forming the interlayer insulating film as including chamber 512 for forming the film, a gas inlet 510 for introducing the reaction gas into the chamber, a wafer 515, a gas discharging device 511 for uniformly dispersing the source gas onto the wafer 515, a wafer holder 513 containing a heater and a gas outlet 514 for exhausting the source gas from the chamber.

A pipe 509 is connected to the gas inlet 510 and branch pipes 517, 518, 519 and 520 are connected to an upstream portion of the pipe 509. The branch pipe 517 is used to supply Ar (argon) and the branch pipe 518 is used to supply $H_2$ (hydrogen). An ozone generator 506 is connected to the branch pipe 519. $O_2$ introduced from the upstream is partly changed to $O_3$, and thus a mixed gas of $O_2$ and $O_3$ is introduced into the pipe 509. A container 507 containing TEOS (Tetra-Ethyl-C)rtho-Silicate) is connected to the branch pipe 520. Ar or He containing TEOS is introduced into the pipe 520 by bubbling of Ar or He through the TEOS. The pipes 509 and 520 are heated by a heater 527 so that TEOS in the pipe is not liquefied. Numeral 508 denotes the heater for heating TEOS. Additionally, MFC (a flow rate controller) is provided in each of these branch pipes. Control signals 521, 522, 523 and 524 are output from control means 501 to the MFCs. The reaction gas is controlled by these control signals so that the reaction gas is supplied at a desired flow rate.

A high-frequency power generator 516 supplies RF power at a frequency of 13.56 MHz to the discharging device 511. A high-frequency voltage generator 530 supplies the RF power at a frequency of 400 kHz to the wafer holder 513, and switching means 526 and 529 route the RF power generated by the high-frequency power generators 516 and 530 to the chamber.

Control signals 525 and 528 are output from the control means 501 to the switching means 526 and 529, respectively, so that the tine of application of the RF power is controlled.

FIGS. 4 and 5 show the flow rates of the reaction gas and the tine of application of the HF power which are controlled by the control means 501.

During the time period from T1 to T2 in FIG. 4, MFC 502 (for supplying Ar), MFC 503 (for supplying H$_2$) and MFC 505 (for supplying TEOS) are opened and MFC 504 (for supplying O$_2$) is closed by the control signals 521, 522, 523 and 524. Thus, Ar, H$_2$ and TEOS are introduced into the chamber. At the same tine, the switching means 526 and 529 are turned on by the control signals 525 and 528, respectively, whereby the RF power is applied to the chamber 512. Thus, during the time period from T1 to T2, the PECVD (plasma enhances chemical vapor deposition) takes place in the chamber in an atmosphere of Ar, H$_2$ and TEOS. During this time period, the wafer is kept at 350° C. by a substrate holder 513 containing a heater.

During the time period from T2 to T3 in FIG. 4, the MFC 502 (for supplying Ar), the MFC 503 (for supplying H$_2$) and the MFC 505 (for supplying TEOS) are closed and the MFC 504 (for supplying O$_2$) is opened by the control signals 521, 522, 523 and 524. At the same time, the switching means 526 and 529 are turned off by the control signals 525 and 528, respectively, whereby no RF power is applied to the chamber 512. Thus, O$_2$ alone is introduced into the chamber, so that the annealing by O$_2$ occurs in the chamber. During this time period, the wafer is kept at 350° C. by the substrate holder 513 containing the heater. In FIG. 4, Ti=5 sec. T2=10 sec and T3=1 sec.

FIG. 5 shows another example of the flow rates of the reaction gas and the time of application of the RF power which are controlled by the control means 501. FIG. 11 differs from FIG. 4 in the flow rate of O$_2$ and the time of application of the RF power.

During the time period from T1 to T2 in FIG. 5, all of the MFC 502 (for supplying Ar), the MFC 503 (for supplying H$_2$), the MFC 504 (for supplying O$_2$) and the MFC 505 (for supplying TEOS) are opened by the control signals 521, 522, 523 and 524. Thus, Ar, H$_2$, O$_3$ and TEOS are introduced into the chamber. At the same dine, the switching means 526 and 529 are turned on by the control signals 525 and 528, respectively, whereby the RF power is applied to the chamber. Thus, during the time period from T1 to T2, the PECVD (plasma enhanced chemical vapor deposition) takes place in the chamber in an atmosphere of Ar, H$_2$, O$_3$ and TEOS. During this time period, the wafer is kept at 350° C. by the substrate holder 513 containing the heater.

During the time period from T2 to T3 in FIG. 5, the MFC 502 (for supplying Ar), the MFC 503 (for supplying H$_2$) and the MFC 505 (for supplying TEOS) are closed by the control signals 521, 522 and 524. The O$_2$ flow rate during this time period is increased by the control signal 523, over the O$_2$ flow rate during the time period from T1 to T2. Moreover, RF power is applied to the chamber differently than in FIG. 4. O$_2$ alone is introduced into the chamber, so that the annealing by O$_2$ occurs in an O$_2$ plasma. During this time period, the wafer is kept at 350° C. by the substrate holder 513 with the built-in heater. In FIG. 5, Ti=5 sec, T2=10 sec and T3=15 sec.

What is claimed is:

1. A method for forming an interlayer insulating film comprising the steps of:
    (1) forming a SiO$_2$ film containing boron, carbon and H$_2$O on a substrate by plasma enhanced chemical vapor deposition using a source gas containing an Si—C—O—H compound, an oxidative gas and a compound containing boron; and
    (2) annealing said SiO$_2$ film as formed in step (1) while said SiO$_2$ film is in contact with oxygen gas or an oxygen plasma to release carbon and H$_2$O from said SiO$_2$ film, and thereby convert said SiO$_2$ film into a porous SiO$_2$ film containing boron.

2. A method according to claim 1, wherein an inert gas is to said source gas.

3. A method according to claim 2, wherein said inert gas is Ar.

4. A method according to claim 1, wherein said annealing is performed by an oxygen plasma.

5. A method according to claim 1, wherein a temperature of said substrate for said annealing is higher than the temperature for forming said film containing boron, carbon and OH.

6. A method according to claim 1, wherein said Si—C—O—H compound is one selected from the group consisting of compounds designated by a general formula $_{Si}$(O)R)nH$_{4-n}$, wherein R=CH$_3$ or C$_2$H$_5$, and n=1 to 3.

7. A method according to claim 1, wherein an underlying insulating film is formed on said substrate, and said porous SiO$_2$ film is formed on said underlying insulating film.

8. A method according to claim 1, wherein said interlayer insulating film is formed, and then a cover insulating film is formed on said interlayer insulating film.

9. A method for forming an interlayer insulating film comprising:
    a first step of forming a film containing a C—O—H polymer on a substrate by plasma enhanced chemical vapor deposition using a source gas containing an Si—C—O—H compound and H$_2$; and
    a second step of annealing said film, releasing the C—O—H polymer contained in said film from said film, and thereby forming a porous SiO$_2$ film on said substrate.

10. A method according to claim 9, wherein said first step and said second step are alternately repeated.

11. A method according to claim 9, wherein O$_2$ is added to said source gas.

12. A method according to claim 9, wherein an inert gas is added to said source gas.

13. A method according to claim 12, wherein said inert gas is Ar.

14. A method according to claim 9, wherein said annealing is performed by O (oxygen) plasma.

15. A method according to claim 9, wherein a temperature of said substrate for said annealing is higher than the temperature for forming said film containing the C—O—H polymer.

16. A method according to claim 9, wherein said Si—C—O—H compound is one selected from the group consisting of compounds designated by a general formula $Si(OR)_nH_{4-n}$ ($R=CH_3$ or $C_2H_5$, n=1 to 3).

17. A method according to claim 9, wherein an underlying insulating film is formed on said substrate, and said porous $SiO_2$ film is formed on said underlying insulating film.

18. A method according to claim 9, wherein said porous $SiO_2$ film is formed, and then said porous $SiO_2$ film is subjected to H (hydrogen) plasma treatment.

19. A method according to claim 9, further comprising the steps of:

forming said interlayer insulating film on said substrate and then forming a damascene trench in said interlayer insulating film;

forming a side wall insulating film on sides of said damascene trench;

embedding a metal film in said damascene trench; and forming a barrier metal layer on said metal film.

20. A method according to claim 19, wherein said side wall insulating film is formed by the steps of:

forming said damascene trench and then forming a first insulating film in said interlayer insulating film, on the sides of said damascene trench and on a bottom of said damascene trench; and anisotropically etching said first insulating film to such an extent that said first insulating film formed on the sides of said damascene trench remains and said first insulating film formed in the bottom of said damascene trench is removed.

21. A method according to claim 9, further comprising the steps of:

forming said interlayer insulating film on said substrate and then forming a damascene trench in said interlayer insulating film;

forming a barrier metal layer on the sides and bottom of said damascene trench;

embedding a metal film in said damascene trench; and forming an anti-oxidizing film on said metal film.

22. A method according to claim 14, wherein said interlayer insulating film is formed, and then a cover insulating film is formed on said interlayer insulating film.

23. A method for forming an interlayer insulating film comprising the steps of:

forming a $SiO_2$ film containing boron, carbon and $H_2O$ on a substrate by plasma enhanced chemical vapor deposition using a source gas containing an Si—C—O—H compound, and oxidative gas and a compound containing boron;

annealing said $SiO_2$ film while said $SiO_2$ film is in contact with oxygen gas or an oxygen plasma to release carbon and $H_2O$ form said $SiO_2$ film, and thereby convert said $SiO_2$ film into a porous $SiO_2$ film containing boron; and contacting said porous $SiO_2$ film with a hydrogen plasma.

24. A method for forming an interlayer insulating film comprising the steps of:

forming a $SiO_2$ film containing boron, carbon and $H_2O$ on a substrate by plasma enhanced chemical vapor deposition using a source gas containing an Si—C—O—H compound, and oxidative gas and a compound containing boron;

annealing said $SiO_2$ film while said $SiO_2$ film is in contact with oxygen gas or an oxygen plasma to release carbon and $H_2O$ from said $SiO_2$ film, and thereby convert said $SiO_2$ film into a porous $SiO_2$ film containing boron;

after forming said interlayer insulating film on said substrate, forming a damascene trench in said interlayer insulating film;

forming a side wall insulating film on sides of said damascene trench;

embedding a metal film in said damascene trench; and forming a barrier metal layer on said metal film.

25. A method according to claim 24, wherein said side wall insulating film is formed by the steps of:

forming said damascene trench and then forming a first insulating film on said interlayer insulating film, on the sides of said damascene trench and on a bottom of said damascene trench; and anisotropically etching said first insulating film to such an extent that said first insulating film formed on the sides of said damascene trench remains and said first insulating film formed on the bottom of said damascene trench is removed.

26. A method for forming an interlayer insulating film comprising the steps of:

forming a $SiO_2$ film containing boron, carbon and $H_2O$ on a substrate by plasma enhanced chemical vapor deposition using a source gas containing an Si—C—O—H compound, and oxidative gas and a compound containing boron;

annealing said $SiO_2$ film while said $SiO_2$ film is in contact with oxygen gas or an oxygen plasma to release carbon and $H_2O$ from said $SiO_2$ film, and thereby convert said $SiO_2$ film into a porous $SiO_2$ film containing boron;

after forming said interlayer insulating film on said substrate, forming a damascene trench in said interlayer insulating film;

forming a barrier metal layer on the sides and bottom of damascene trench;

embedding a metal film in said damascene trench; and forming and anti-oxidizing film in said metal film.

* * * * *